United States Patent
Haque et al.

(10) Patent No.: US 8,532,039 B2
(45) Date of Patent: Sep. 10, 2013

(54) METHOD FOR A RADIO FREQUENCY (RF) SAMPLING APPARATUS WITH ARRAYS OF TIME INTERLEAVED SAMPLERS AND SCENARIO BASED DYNAMIC RESOURCE ALLOCATION

(75) Inventors: Tanbir Haque, Jackson Heights, NY (US); Leonid Kazakevich, Plainview, NY (US); Scott M. Newton, Commack, NY (US)

(73) Assignee: InterDigital Patent Holdings, Inc., Wilmington, DE (US)

( * ) Notice: Subject to any disclaimer, the term of this patent is extended or adjusted under 35 U.S.C. 154(b) by 495 days.

(21) Appl. No.: 12/716,514

(22) Filed: Mar. 3, 2010

(65) Prior Publication Data

US 2010/0226330 A1 Sep. 9, 2010

Related U.S. Application Data

(60) Provisional application No. 61/156,979, filed on Mar. 3, 2009.

(51) Int. Cl.
*H04J 1/00* (2006.01)
*H04W 4/00* (2009.01)
*H04B 7/212* (2006.01)

(52) U.S. Cl.
USPC ........... 370/329; 370/277; 370/327; 370/328; 370/342; 370/343; 455/234.1; 455/295; 455/296; 455/307

(58) Field of Classification Search
USPC .......................... 370/328–463; 455/230–307
See application file for complete search history.

(56) References Cited

U.S. PATENT DOCUMENTS

| | | | | |
|---|---|---|---|---|
| 5,862,803 A * | 1/1999 | Besson et al. | | 600/508 |
| 6,289,238 B1 * | 9/2001 | Besson et al. | | 600/509 |
| 6,577,893 B1 * | 6/2003 | Besson et al. | | 600/509 |
| 6,864,817 B1 * | 3/2005 | Salvi et al. | | 341/139 |
| 7,075,471 B1 * | 7/2006 | Gupta | | 341/155 |
| 7,215,991 B2 * | 5/2007 | Besson et al. | | 600/509 |
| 7,253,761 B1 * | 8/2007 | Hoyos et al. | | 341/155 |
| 7,848,708 B2 | 12/2010 | Matsumoto et al. | | |
| 7,984,651 B2 * | 7/2011 | Randall et al. | | 73/661 |
| 8,078,130 B2 * | 12/2011 | Fudge et al. | | 455/295 |
| 8,081,946 B2 * | 12/2011 | Fudge | | 455/295 |
| 8,085,685 B2 * | 12/2011 | Olgaard | | 370/252 |
| 2004/0080439 A1 * | 4/2004 | Van Der Mee | | 341/139 |
| 2005/0190089 A1 * | 9/2005 | Draxelmayr et al. | | 341/141 |
| 2006/0187105 A1 * | 8/2006 | Sakata et al. | | 341/155 |
| 2006/0279445 A1 * | 12/2006 | Kinyua et al. | | 341/155 |
| 2007/0208235 A1 * | 9/2007 | Besson et al. | | 600/301 |

(Continued)

OTHER PUBLICATIONS

Jabbour et al., "Optimizing the number of channels for time interleaved sample-and-hold circuits," 6th International IEEE Northeast Workshop on Circuits and Systems and TAISA Conference, pp. 245-248 (Jun. 2008).

(Continued)

*Primary Examiner* — Ayaz Sheikh
*Assistant Examiner* — Venkatesh Haliyur
(74) *Attorney, Agent, or Firm* — Volpe and Koenig, P.C.

(57) ABSTRACT

A method and apparatus for dynamic resource allocation of an RF sampling system based on a signal quality measurement determined by generating a plurality of time-interleaved samples from a received radio frequency (RF) signal and combining the plurality of time-interleaved samples to generate the signal quality.

18 Claims, 16 Drawing Sheets

(56) References Cited

U.S. PATENT DOCUMENTS

2009/0222226 A1* 9/2009 Baraniuk et al. ............... 702/66
2010/0091688 A1* 4/2010 Staszewski et al. ........... 370/277
2010/0226330 A1* 9/2010 Haque et al. .................. 370/329
2011/0069624 A1* 3/2011 Olgaard ........................ 370/252
2012/0194223 A1* 8/2012 Singh et al. ..................... 327/94

OTHER PUBLICATIONS

Maurer et al., "Be flexible," IEEE Microwave Magazine, vol. 9, No. 2, pp. 83-95 (Apr. 2008).

* cited by examiner

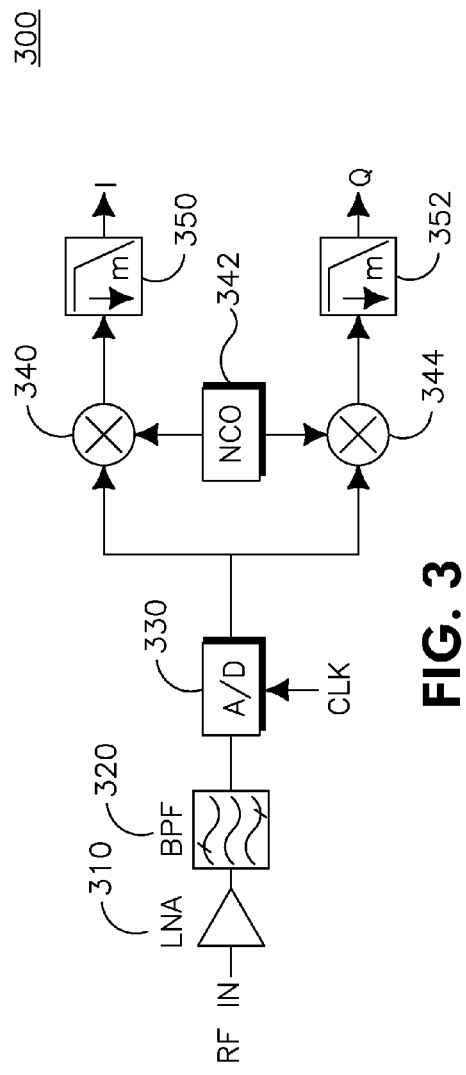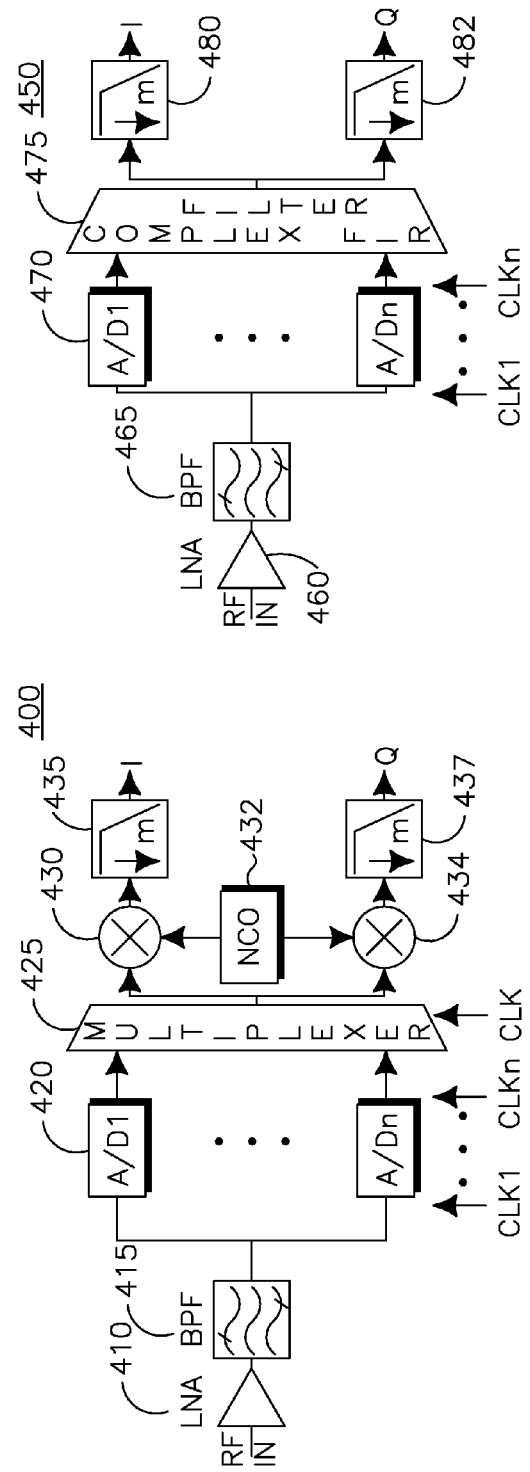

METHOD FOR A RADIO FREQUENCY (RF) SAMPLING APPARATUS WITH ARRAYS OF TIME INTERLEAVED SAMPLERS AND SCENARIO BASED DYNAMIC RESOURCE ALLOCATION

CROSS REFERENCE TO RELATED APPLICATION

This application claims the benefit of U.S. Provisional Application Ser. No. 61/156,979 filed on Mar. 3, 2009 hereby incorporated by reference as if fully set forth herein.

FIELD OF INVENTION

This application is related to wireless communications.

BACKGROUND

The demand for flexible and easily reconfigurable receivers along with the relatively recent emergence of low cost, high speed, integrated circuit technology has lead to the increasing popularity of a broad class of radio receivers employing direct radio frequency (RF) to baseband sampling. Examples of these radio receivers may be found in communications as well as instrumentation (i.e., oscilloscopes, spectrum analyzers, or the like) systems.

While IF (intermediate frequency) sampling receivers are used to down-convert a received signal to an intermediate frequency, these types of architectures are not particularly suitable for low cost, low power, high fidelity, flexible commercial communications systems that receive GHz RF signals. RF sampling systems that employ time interleaved data converters are more suitable for low power, high fidelity GHz RF applications.

Even though time interleaving makes possible the efficient implementation of high resolution and high rate sampling systems, it does not improve clock jitter immunity. Clock jitter has a very deleterious impact on sampling systems. Clock jitter manifests as noise at the output of a sampler and therefore may degrade the signal to noise ratio (SNR) performance delivered by the sampler. When sampling high frequency (GHz RF) signals, the clock jitter performance required for high resolution sampling receiver systems may be impractical for low cost, low power commercial communications applications.

While some systems do deliver improved clock jitter immunity, they are not particularly flexible or necessarily power efficient. Therefore, there is a need for sampling systems that delivers improved clock jitter immunity with increased flexibility.

SUMMARY

A method and apparatus for dynamic resource allocation of an RF sampling system based on a signal quality measurement determined by generating a plurality of time-skewed or time-interleaved samples from a received radio frequency (RF) signal and combining the plurality of time-skewed or time-interleaved samples to generate the signal quality.

BRIEF DESCRIPTION OF THE DRAWINGS

A more detailed understanding may be had from the following description, given by way of example in conjunction with the accompanying drawings wherein:

FIG. 3 shows an RF sampling receiver with a single A/D in accordance with the prior art;

FIG. 4A shows an RF sampling receiver with an array of time-interleaved A/Ds according to an embodiment in accordance with the prior art;

FIG. 4B shows an RF sampling receiver with an array of time-interleaved A/Ds according to an embodiment in accordance with the prior art;

DETAILED DESCRIPTION

When referred to hereafter, the terminology "wireless transmit/receive unit (WTRU)" includes but is not limited to a user equipment (UE), a mobile station, a fixed or mobile subscriber unit, a pager, a cellular telephone, a personal digital assistant (PDA), a computer, or any other type of device capable of operating in a wireless environment. When referred to hereafter, the terminology "base station" includes but is not limited to a Node-B, a site controller, an access point (AP), a relay, a repeater, or any other type of interfacing device capable of operating in a wireless environment.

Figure 1:
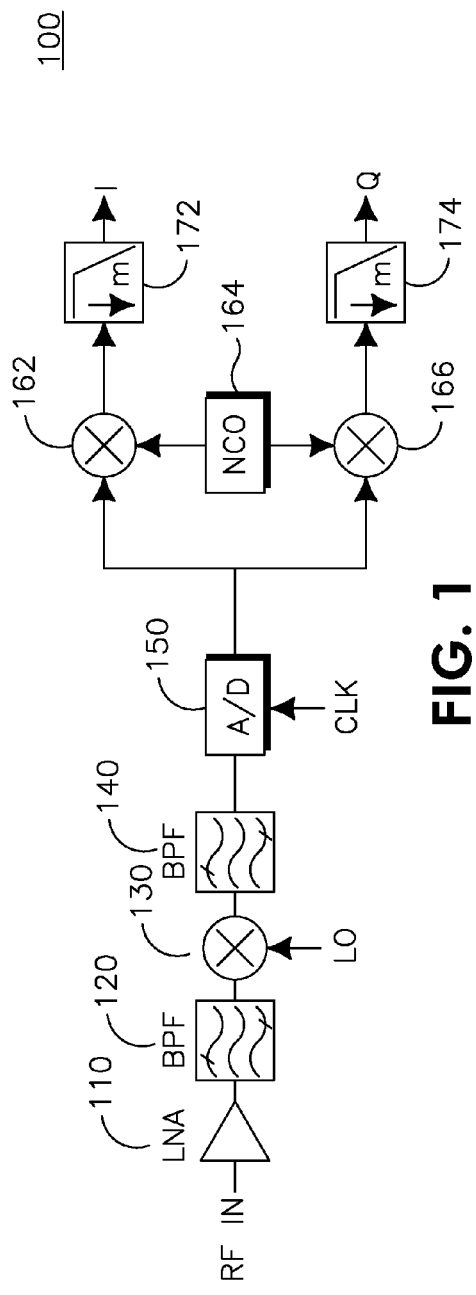
FIG. 1 shows an IF sampling receiver with a single A/D in accordance with the prior art.
Figure 2A:
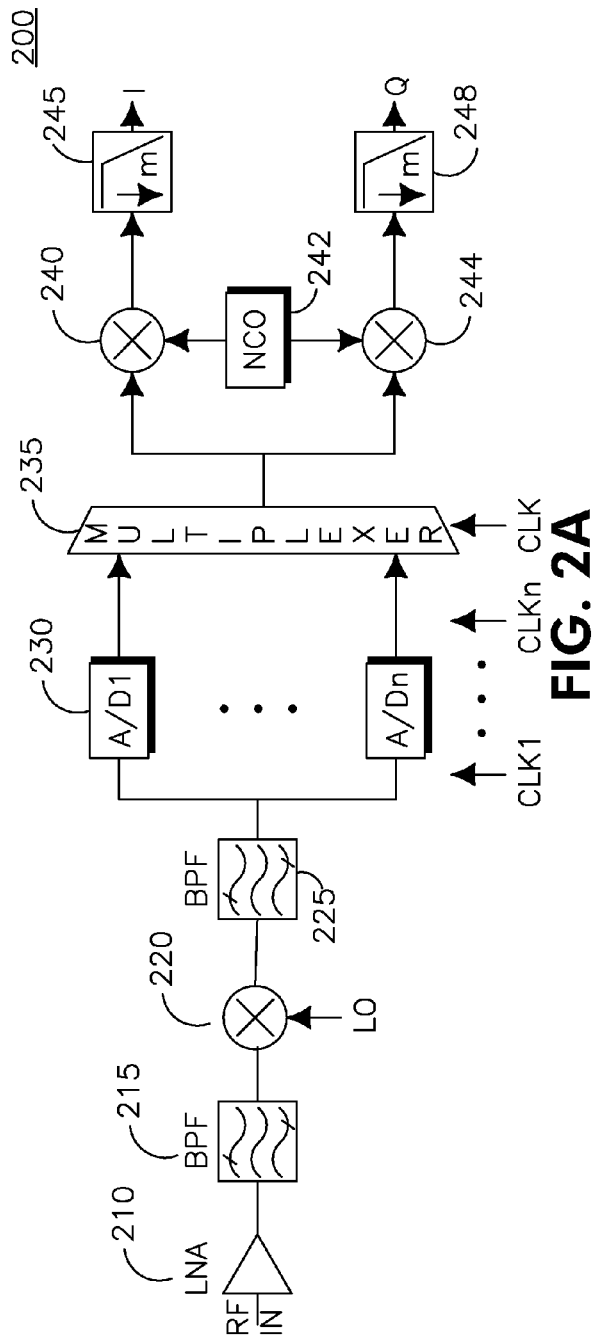
FIG. 2A shows an IF sampling receiver with an array of time-interleaved A/Ds according to an embodiment in accordance with the prior art.
Figure 2B:
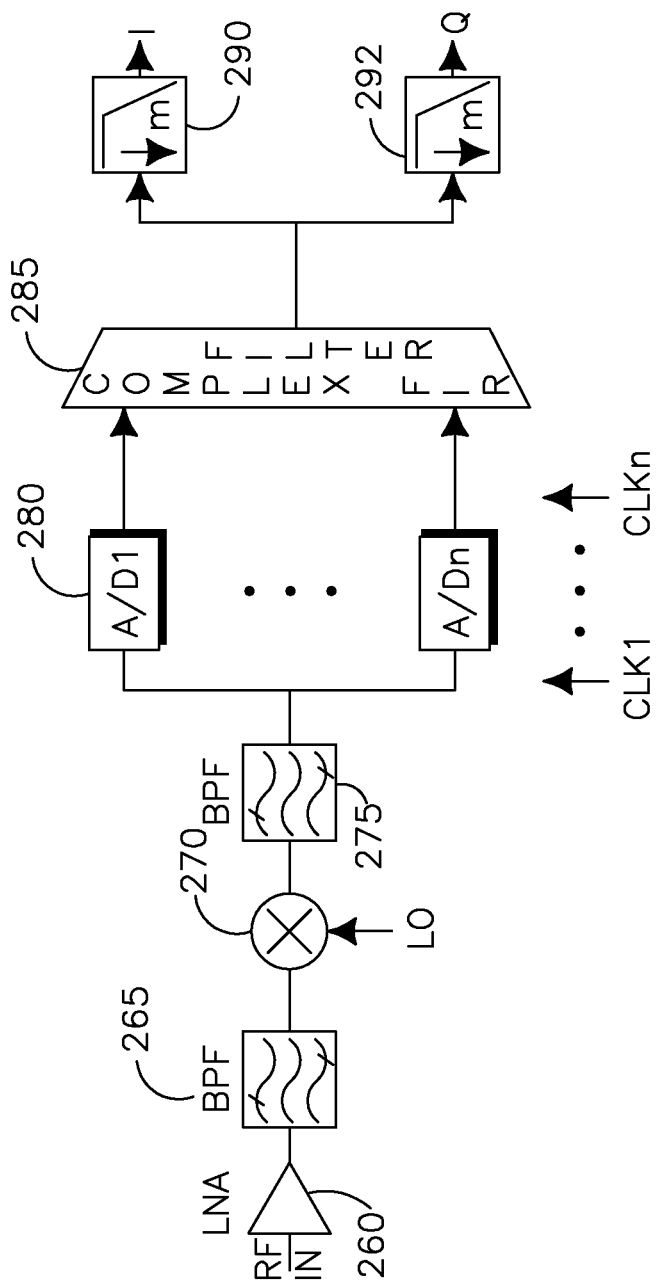
FIG. 2B shows an IF sampling receiver with an array of time-interleaved A/Ds according to an embodiment in accordance with the prior art.

FIGS. 1, 2A and 2B are examples of intermediate frequency (IF) sampling receivers. FIG. 1 shows an example of an IF sampling receiver that employs a single analog-to-digital converter (A/D) 150. In FIG. 1, an RF signal is amplified using a low noise amplifier (LNA) 110 and the signal may be filtered using a bandpass filter (BPF) 120. A mixer 130 may down-convert the received signal to an intermediate frequency. The signal may be filtered through a second BPF 140. The signal may be passed to a single A/D 150 to sample the signal. A numerically controlled oscillator (NCO) 164 may be used to generate sine and cosine waveforms that are passed to multipliers 162 and 166. The multipliers 162 and 166 may receive the sampled signal from the A/D 150 and produce complex signals that may be passed to decimation filters 172 and 174. The decimation filters 172 and 174 reduce the transmission rate for outputting the in-phase and quadrature-phase (IQ) complex samples.

FIGS. 2A and 2B show two examples of IF sampling receivers that use an array of time-skewed or time-interleaved A/Ds 230 and 280 and methods for re-assembling the time-skewed or time-interleaved samples using either a multiplexor 235 or a finite impulse response (FIR) filter 285. In FIG. 2A, the received signal may be amplified using LNA 210, may be filtered using a BPF 215, may be down-converted by a mixer 220 and may be passed to a second BPF 225. The signal may be passed to an array of time-skewed or time-interleaved A/Ds 230. The time-skewed or time-interleaved A/Ds 230 produce time-skewed or time-interleaved samples. The time-skewed or time-interleaved samples may be passed to a multiplexor 235 for re-assembling of the time-skewed or time-interleaved samples from the array of A/Ds 230. A NCO 242 may be used to generate sine and cosine waveforms. The multipliers 240 and 244 may receive the sampled signal from the multiplexor 235 to produce complex in-phase and quadrature phase signals that may be passed to decimation filters 245 and 248. The decimation filters 245 and 248 reduce the transmission rate for outputting IQ complex samples.

Time interleaving is used to reduce the sampling rate requirements of individual A/Ds in an array. The sampling rate is the rate at which new digital values are sampled from a signal. Time interleaving increases the overall sampling speed of a system by operating two or more A/Ds in parallel. A time-interleaved array of size N uses A/Ds that operate at a rate that is N times lower (fs/N) than the required overall sampling rate (fs), but provides an aggregate sampling rate that is equal to the required overall sampling rate, where N is an integer. Reducing the sampling rate facilitates a more efficient and lower power implementation of higher bit width A/Ds. Thus, for a given power consumption level, time-interleaved A/D arrays deliver higher resolution and bit width, at the cost of some added complexity compared to a single A/D of similar performance (i.e., sampling rate).

In FIG. 2B, the received signal may be amplified using LNA 260, may be filtered using a BPF 265, may be down-converted by a mixer 270 and may be passed to a second BPF 275. The signal may be passed to an array of time-skewed or time-interleaved A/Ds 280. The time-skewed or time-interleaved samples may be passed to a complex FIR filter 285 for re-assembling the time-skewed or time-interleaved samples from the array of A/Ds 280. The re-assembled samples may be passed to decimation filters 290 and 292 to reduce the transmission rate for outputting IQ complex samples.

FIG. 3, FIG. 4A and FIG. 4B are examples of direct RF sampling receivers. FIG. 3 shows an example of an RF sampling receiver that employs a single A/D 330. After the RF signal is received, the signal may be amplified using an LNA 310 and filtered by a BPF 320. A mixer is not used to down-convert the received signal before sampling. Instead, a received signal may be directly sampled using a single A/D 330. An NCO 342 may be used to generate sine and cosine waveforms that are passed to multipliers 340 and 344. The multipliers 340 and 344 may receive the sampled signal from the A/D 330 and produce complex signals that may be passed to decimation filters 350 and 352. The decimation filters 350 and 352 reduce the transmission rate for outputting IQ complex samples.

FIG. 4A and FIG. 4B show examples of RF sampling receivers employing an array of time-skewed or time-interleaved A/Ds 420 and 470 and methods for re-assembling the time-skewed or time-interleaved samples using either a multiplexor 425 or a FIR filter 475. In FIG. 4A, the RF signal is received and the signal may be amplified using a LNA 410 and filtered by a BPF 415. The received signal may be directly sampled using an array of time-skewed or time-interleaved A/Ds 420. The time-skewed or time-interleaved samples may be passed to a multiplexor 425. An NCO 432 may be used to generate sine and cosine waveforms that are passed to multipliers 430 and 434. The multipliers 430 and 434 may receive the sampled signal from the multiplexor 425 and produce complex signals that may be passed to decimation filters 435 and 437. The decimation filters 435 and 437 reduce the transmission rate for outputting IQ complex samples.

In FIG. 4B, the RF signal is received and the signal may be amplified using an LNA 460 and filtered by a BPF 465. The received signal may be directly sampled using an array of time-skewed or time-interleaved A/Ds 470. The time-skewed or time-interleaved samples may be passed to a FIR filter 475. The re-assembled samples may be passed to decimation filters 480 and 482. The decimation filters 480 and 482 reduce the transmission rate for outputting IQ complex samples.

High frequency GHz RF receivers that employ the architecture illustrated in FIGS. 1 and 3, where only one A/D 150 is utilized, require A/D resolution and sampling rate performance that is impractical for low cost, low power commercial communications applications. Arrays of time-skewed or time-interleaved A/Ds, as shown in FIGS. 2A, 2B 4A and 4B, are more suitable for low power, high frequency GHz RF applications.

Time interleaving makes possible the efficient implementation of high resolution and high rate samplers, but does not improve clock jitter immunity of the resulting sampling system. As mentioned above, clock jitter has a deleterious impact on samplers and can manifests as noise at the output of a sampler degrading the signal to noise ratio (SNR) performance delivered by the sampler.

Voltage samplers such as those shown in FIGS. 1-4B, are particularly susceptible to clock jitter. Further, time-interleaved arrays of voltage samplers are equally susceptible to clock jitter. When sampling high frequency GHz RF signals, the clock jitter performance required for high resolution voltage sampling receiver systems may be impractical for low cost, low power commercial communications applications.

Integrating samplers or charge samplers are used by a sub-class of RF sampling receivers. Charge samplers may be configured as either a lowpass or bandpass sampler. Compared to voltage samplers, charge samplers are known to be less susceptible to clock jitter. Typical examples of charge sampling receiver systems found in the communications industry are shown in FIGS. 5A and 5B.

Figures 5A, 5B:
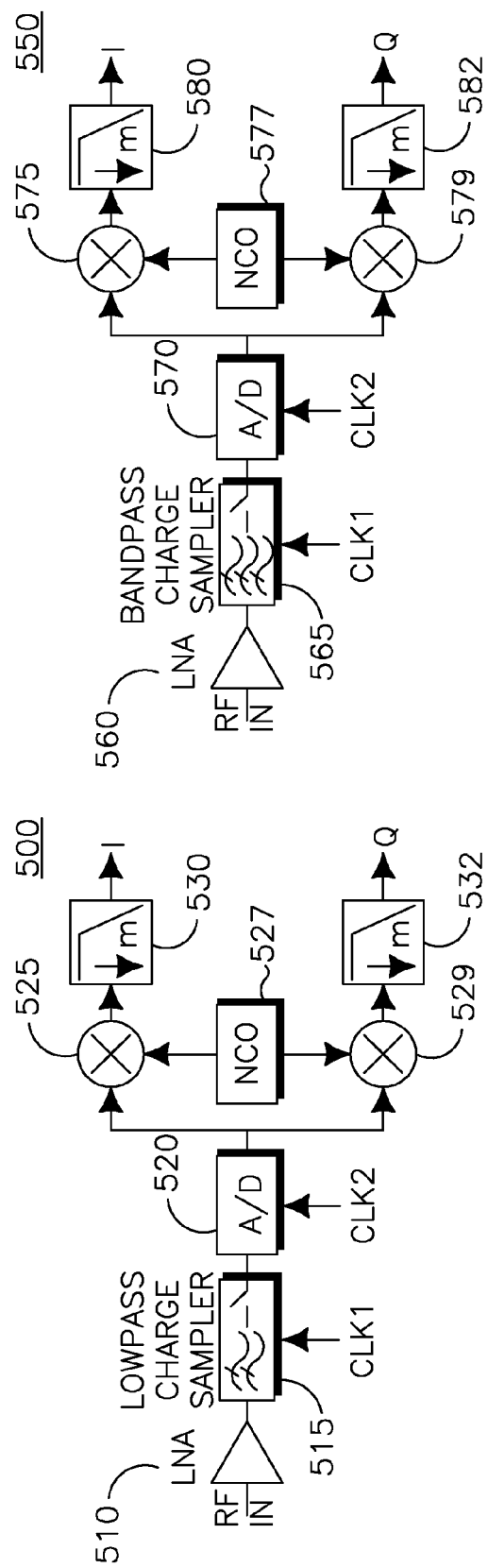
FIG. 5A shows an RF sampling receiver with a single lowpass charge sampler and a single A/D in accordance with the prior art.
FIG. 5B shows an RF sampling receiver with a single bandpass charge sampler and a single A/D in accordance with the prior art.

FIG. 5A and FIG. 5B shows two examples of RF sampling receivers that use either a single lowpass charge sampler 515 or a single bandpass charge sampler 565, and a single A/D 520, 570. In FIG. 5A, an LNA 510 amplifies the RF signal and a lowpass charge sampler 515 samples it. The sampled signal is passed to a single A/D 520. An NCO 527 may be used to generate sine and cosine waveforms that are passed to multipliers 525 and 529. The multipliers 525 and 529 may receive the sampled signal from the A/D 520 and produce complex signals that may be passed to decimation filters 530 and 532.

The decimation filters 530 and 532 reduce the transmission rate for outputting IQ complex samples.

FIG. 5B shows an RF signal that is amplified using an LNA 560 and sampled by a bandpass charge sampler 565. The sampled signal is passed to a single A/D 570. An NCO 577 may be used to generate sine and cosine waveforms that are passed to multipliers 575 and 579. The multiplier 575 and 579 may receive the sampled signal from the A/D 570 and produce complex signals that may be passed to decimation filters 580 and 582. The decimation filters 580 and 582 reduce the transmission rate for outputting IQ complex samples.

While the systems shown in FIG. 5A and FIG. 5B may deliver improved clock jitter immunity, they are not particularly flexible or necessarily power efficient.

Figure 6:
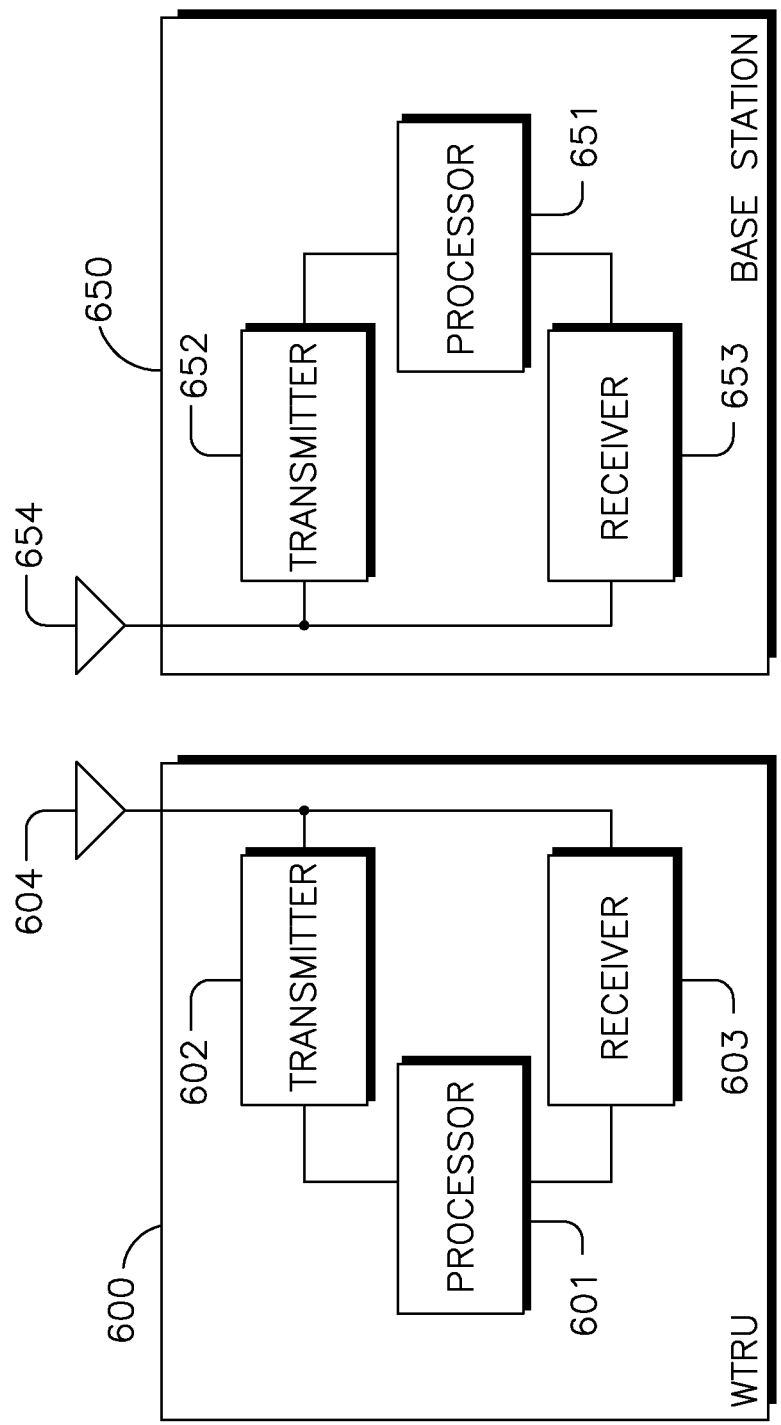
FIG. 6 shows a functional block diagram of a wireless communication system.

FIG. 6 is a functional block diagram of a wireless communication system including a WTRU 600 and a base station (BS) 650. The WTRU 600 includes a processor 601 in communication with a receiver 602, transmitter 603, and antenna 604. The BS 650 includes a processor 651 in communication with a receiver 652, transmitter 653, and antenna 654. The WTRU 600 and BS 650 may include additional transmitters and receivers (not depicted) in communication with the processor 601, 651 and antenna 604, 654 for use in multi-mode operation, as well as other components described below.

Referring to FIG. 6, the processors 601, 651 are configurable to generate and decode the messages and signals as described below with respect to FIGS. 7, 8, 9 and 10. The transmitters 603, 653 and receivers 602, 652 are configurable to send and receive, respectively, the messages and signals as described below with reference to FIGS. 7, 8, 9 and 10.

Referring again to FIG. 6, the receivers 602, 652 may receive an RF signal and may use both time-interleaved charge samplers and time-interleaved voltage samplers to improve clock jitter immunity and flexibility within the WTRU.

Figure 7:
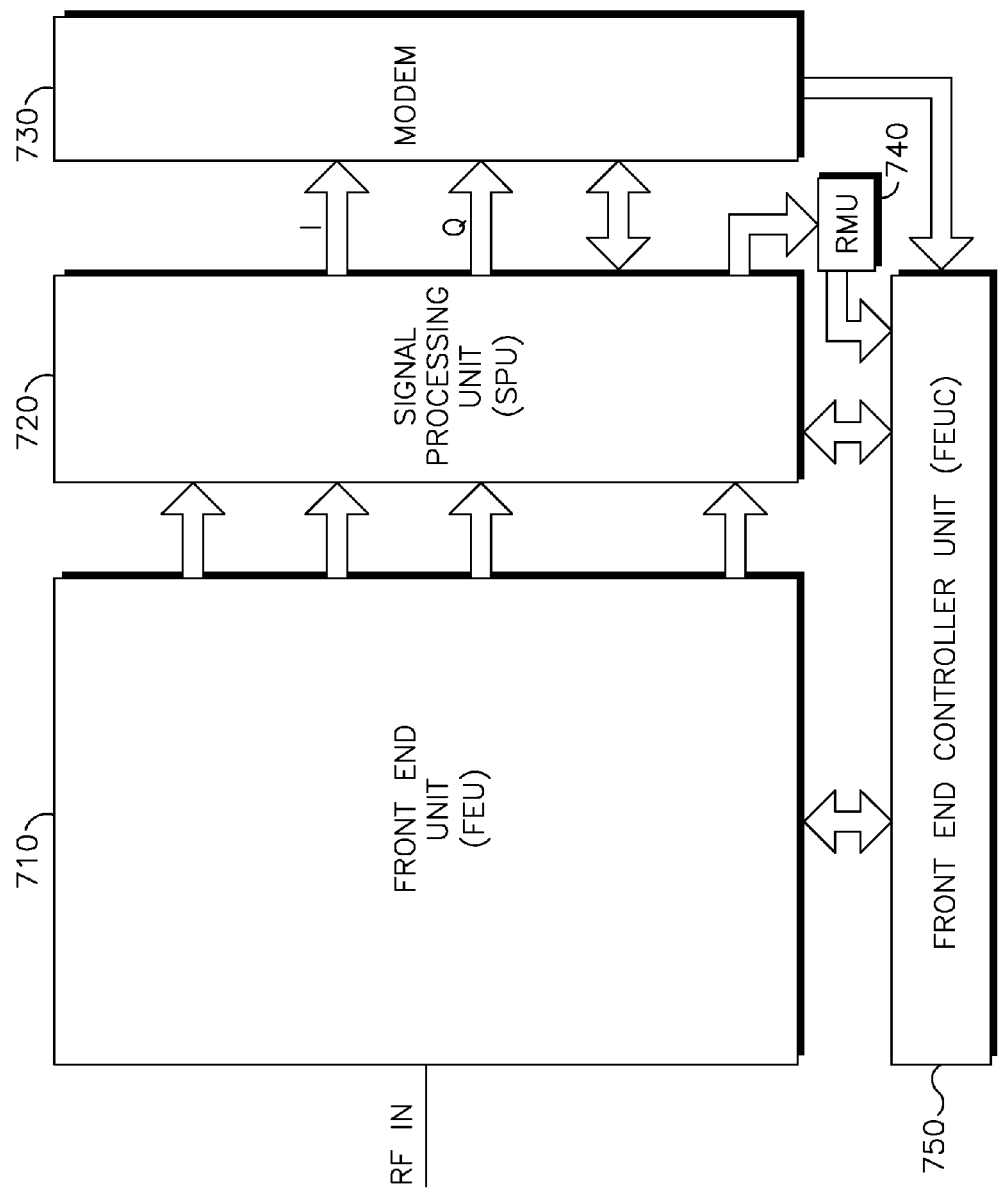
FIG. 7 shows a high level block diagram of a sampling WTRU employing an array of time-interleaved samplers.

FIG. 7 is a detailed block diagram of the receivers 602, 652. FIG. 7 shows a front-end unit (FEU) 710 configured to receive a signal and output multiple time-interleaved output samples to the signal processing unit (SPU) 720. The SPU 720 may be configured to combine the samples and may also output IQ signals to a modem 730.

The SPU 720 may be configured to generate a signal quality measurement based on the received multiple time-interleaved output samples and output the signal quality measurement to the resource management unit (RMU) 740. The RMU 740 passes a command based on the signal quality measurement to the front-end unit controller (FEUC) 750. The FEUC 750 may be configured to supply all clock and control signals needed to operate the FEU 710 and may perform FEU 710 resource allocation. The SPU 720 and the FEU 710 may also be coupled to the FEUC 750.

Figure 8:
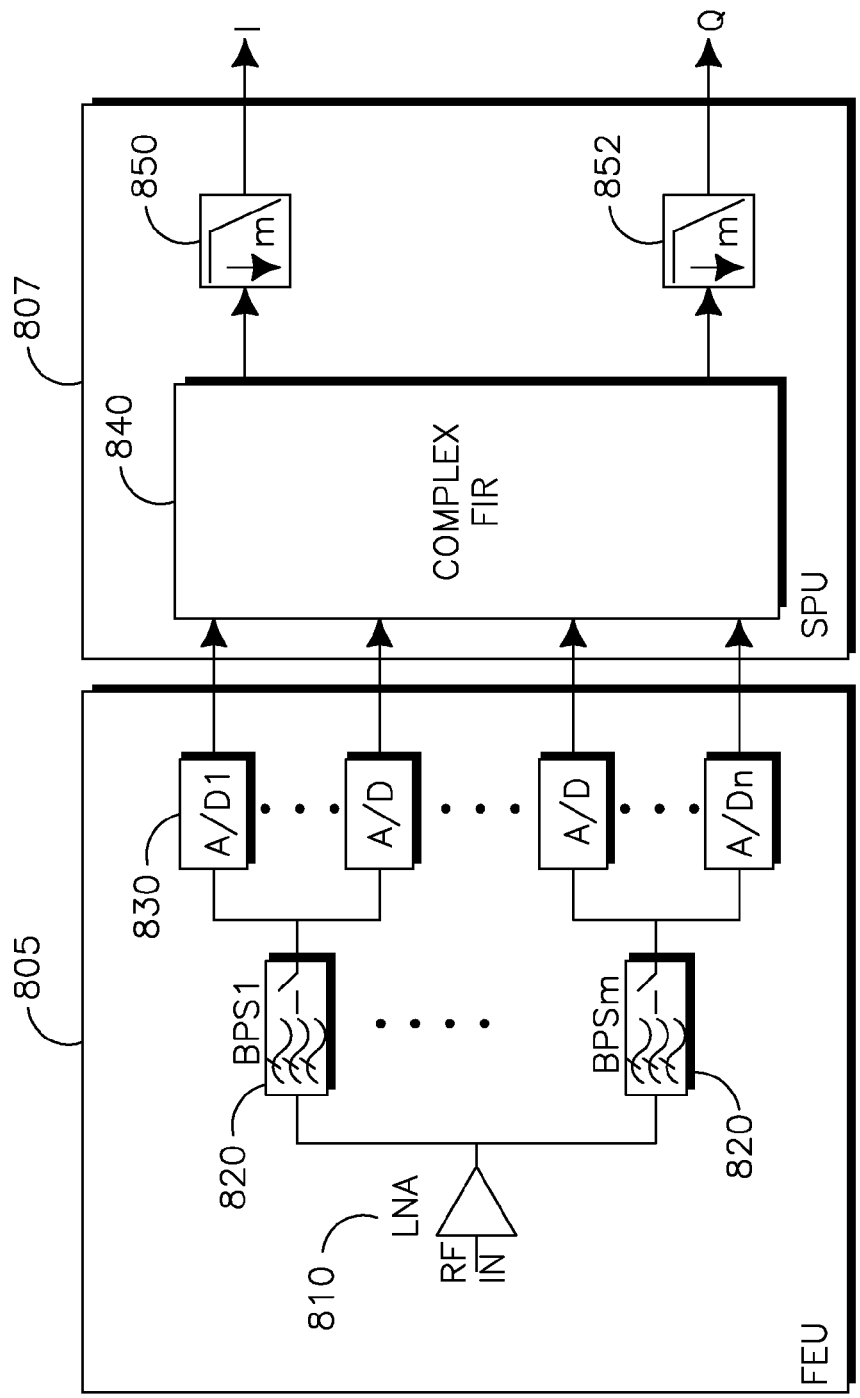
FIG. 8 shows a simplified block diagram of a sampling WTRU employing an array of time-interleaved samplers.

FIG. 8 is a simplified diagram of the FEU 805 and SPU 807. A signal is received by the LNA 810 and is passed to an array of time-interleaved bandpass charge samplers 820. Each time-interleaved bandpass charge sampler 820 is connected to an array of time-interleaved voltage samplers 830, also referred to as A/Ds. The time-interleaved bandpass charge samplers sample the signal and output the samples to an array of time-interleaved voltage samplers 830. By leveraging the benefits of time-interleaved charge samplers and time-interleaved voltage samplers, clock jitter immunity and flexibility may be improved upon. Clock jitter immunity is improved by using charge samplers and flexibility is improved by time interleaving both the charge samplers and the voltage samplers. The array of time-interleaved voltage samplers 830 outputs samples to the SPU 807. Within the SPU 807 is a complex FIR 840 or a multiplexor, not depicted, where the samples are re-assembled. The re-assembled samples are passed to decimation filters 850 and 852 to reduce the transmission rate for outputting IQ complex samples.

Figure 9:
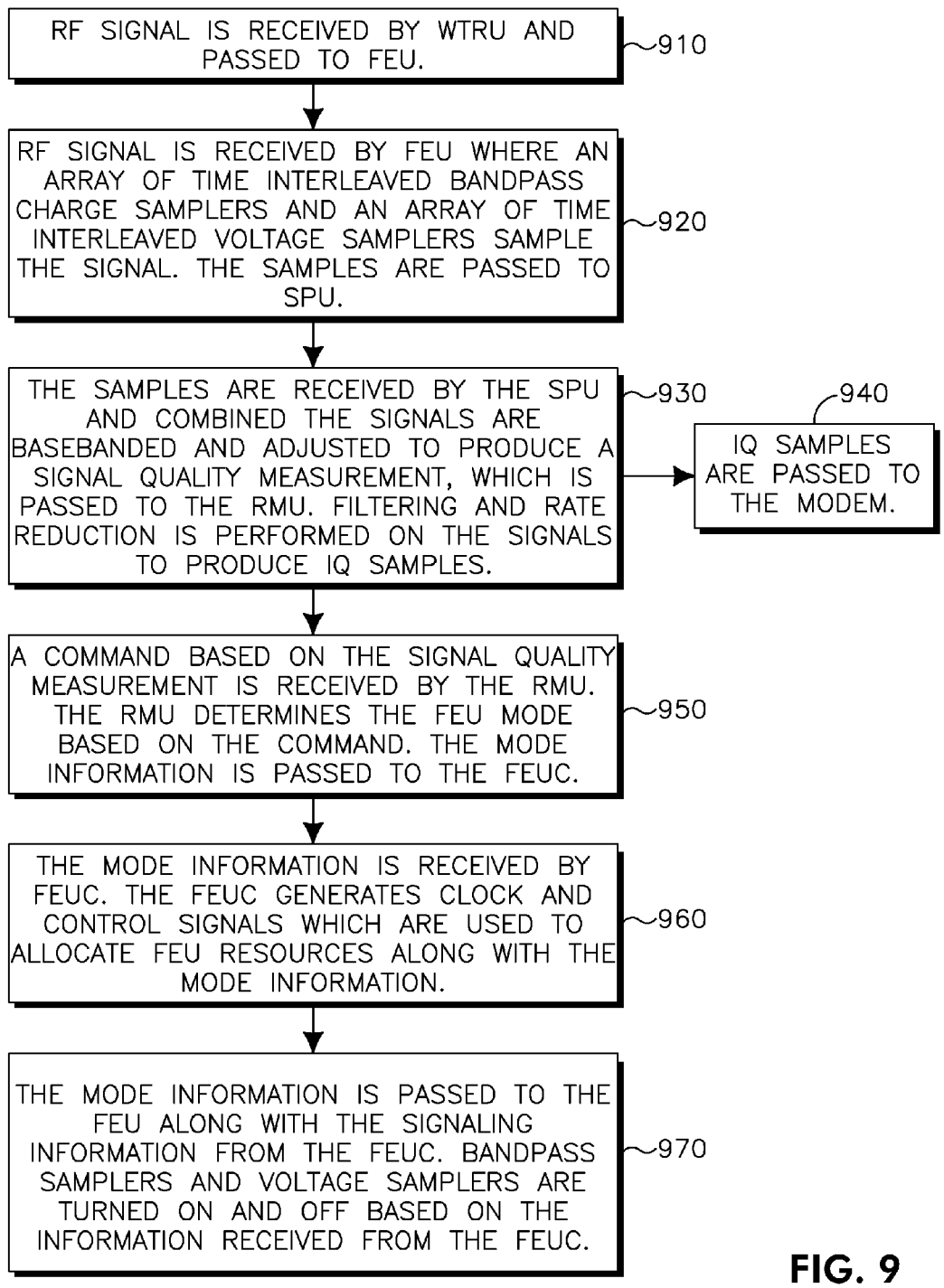
FIG. 9 shows a method of a sampling WTRU employing an array of time-interleaved samplers.

FIG. 9 is a flow diagram of a method for sampling a signal and allocating resources based on the sampled signal. An RF signal is received by a WTRU 910. The signal may be passed to a FEU 910. In the FEU 910 an array of time-interleaved bandpass charge samplers and time-interleaved voltage samplers may sample the signal 920. Multiple time-interleaved samples may be passed to an SPU 920. The SPU may be configured to combine the time-interleaved samples, may be configured to perform necessary signal processing functions and may be configured to baseband the samples 930. A signal quality measurement may be produced and a command based on this measurement may be passed to the RMU 930. IQ output samples may be generated and passed to a modem 940. The RMU receives the command based on the signal quality measurement and may be configured to manage and allocate FEU resources by determining the FEU mode based on the command received 950. The mode information is passed to the FEUC where clock and control signals are generated 950, 960. The mode information is passed to the FEU by the FEUC 970. The FEU mode is then used to determine a sampling rate. Charge sampler and voltage sampler resources are allocated in the FEU based on the sampling rate.

Figure 10:
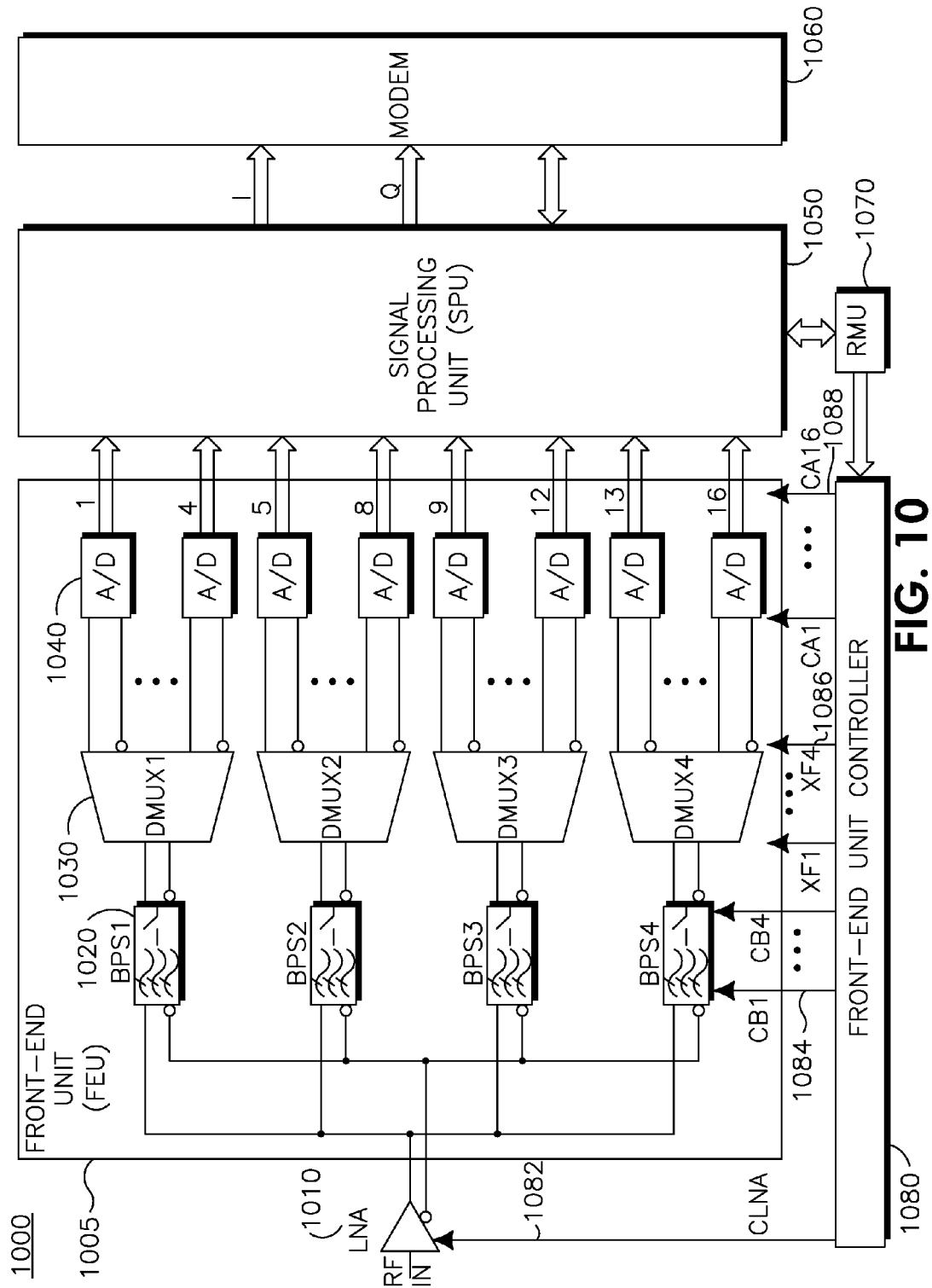
FIG. 10 shows a detailed block diagram of a sampling WTRU employing an array of time-interleaved samplers.

FIG. 10 is a detailed description of a reconfigurable radio frequency (RF) sampling receiver 1000 that may be used in receivers 602, 652 discussed above. The receiver 1000 includes multiple arrays of time-interleaved bandpass charge samplers 1020 and time-interleaved voltage samplers 1040 in a scenario based dynamic resource allocation scheme. The receiver 1000 includes the FEU 1005, the FEUC 1080, the SPU 1050, the RMU 1070 and a modem 1060.

Referring to FIG. 10, the FEU 1005 may include four building blocks. These building blocks may include the LNA 1010, an array of time-interleaved bandpass charge samplers 1020, de-multiplexers (DMUX) 1030 and an array of time-interleaved voltage samplers 1040. A time-interleaved array consisting of at least two time-interleaved bandpass charge samplers 1020 (optionally, at least two time-interleaved low-pass charge samplers are used) receives output from the LNA 1010. The time-interleaved bandpass charge samplers 1020 sample the signal. Each time-interleaved bandpass charge sampler 1020 may be connected to an array of time-interleaved voltage samplers 1040 through a DMUX 1030. The DMUX 1030 takes the output of the time-interleaved bandpass charge samplers 1020 and separates the output over an array of time-interleaved voltage samplers 1040. The time-interleaved voltage samplers 1040 sample the DMUX (1030) output and generate additional samples. The output of the time-interleaved voltage samplers 1040 is passed to the SPU 1050.

Referring again to FIG. 10, the FEUC 1080 may be configured to include control signals CLNA 1082, that are used to control the bias level and the gain of the LNA 1010. The sets of signals, CB1 through CB4 1084, may be used to set the bias level and gain of the four time-interleaved bandpass charge samplers, BPS1 through BPS4 1020.

The sets of signals, XF1 through XF4, 1086, may be used to selectively connect a single time-interleaved voltage sampler 1040 from the bank of four time-interleaved voltage samplers 1040 available to each of the four time-interleaved bandpass charge samplers 1020. For example, the set of signals, XF1 through XF4 1086, may be used to selectively connect a single time-interleaved voltage sampler 1040 from the set A/D1 through A/D4 1040 to BPS1 1020.

The sets of signals, CA1 through CA16 1088, may be used to operate and set the resolution of the time-interleaved voltage samplers 1040 including the clock and control signals used to operate the time-interleaved voltage samplers 1040.

Figure 11:
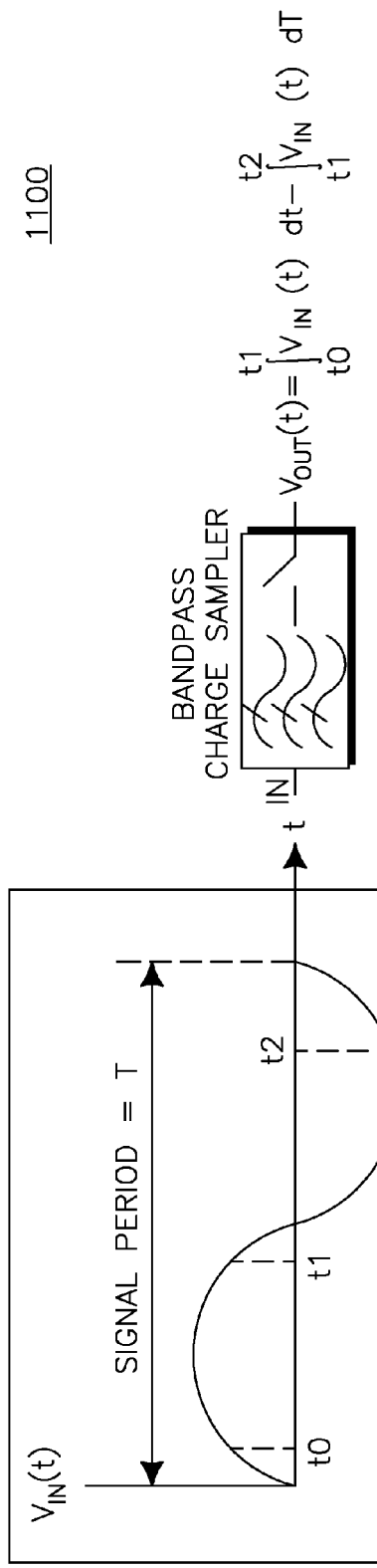
FIG. 11 shows an embodiment of an operating principle of a bandpass charge sampler.

FIG. 11 shows a more detailed description of the transfer function of a time-interleaved bandpass charge sampler 1020 as shown in FIG. 10. A time-interleaved bandpass charge sampler 1020 may be configured to receive an input signal $V_{in}(t)$, from the LNA 1010 and may be configured to manipulate the signal using Equation (1):

$$V_{out}(t) = \int_{t0}^{t1} V_{in}(t)\,dt - \int_{t1}^{t2} V_{in}(t)\,dt \quad \text{Equation [1]}$$

wherein $t1=t0+\Delta$ and $t2=t1+\Delta$, and $\Delta$ is the difference between t0 and t1. Referring to FIG. 10, the time-interleaved bandpass charge sampler may output the result of the transfer function equation to the de-multiplexer 1030. The distance (d) from t0 to t1 is the same as the distance of t1 to t2. The total integration time (t0 to t2) is commensurate (not necessarily equal) to the input signal period (T). The de-multiplexer 1030 provides output from the time-interleaved bandpass charge sampler 1020 to an array of time-interleaved voltage samplers 1040.

Figure 12:
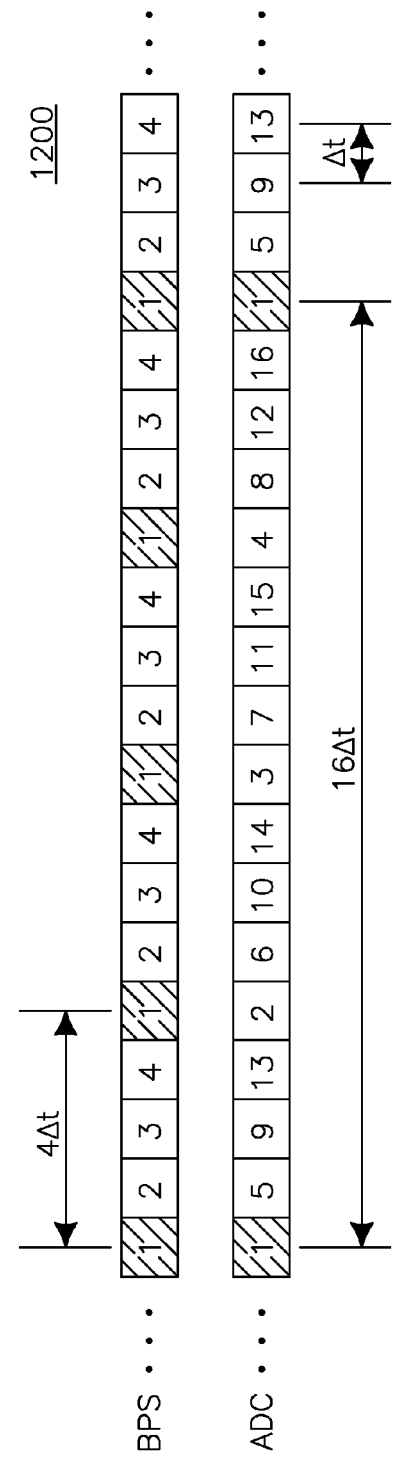
FIG. 12 shows an embodiment of an operating principle of a front-end unit including a resource scheduling scheme for the front-end unit.

FIG. 12 is a further embodiment of the operating principle of the FEU 1020. FIG. 12 illustrates a resource scheduling scheme. The top row indicates time-interleaved bandpass charge samples from four time interleaved bandpass charges samplers 1020 as shown in FIG. 10. In FIG. 12, the sample in bin 1 is received from the time-interleaved bandpass charge sampler BPS1 1020. The samples are time-interleaved and repeat. The bottom row of samples indicates samples from the sixteen time-interleaved voltage samplers 1040.

The aggregate sampling rate (fs) of the FEU may be defined as the inverse of the time delay ($\Delta t$), (fs=1/$\Delta t$), between the successive samples available at the output of the FEU. The sampling rate of each of the four time-interleaved bandpass charge samplers 1020 is a fourth (fs/4) of the aggregate sampling rate (fs). The sampling rate of each of the sixteen time-interleaved voltage samples 1040 is a sixteenth (fs/16), of the aggregate sampling rate (fs). While sixteen time-interleaved voltage samplers 1040 are shown in FIG. 10, all sixteen time-interleaved voltage samplers may not be utilized. The addition of time-interleaved voltage samplers increases efficiency.

Figure 13:
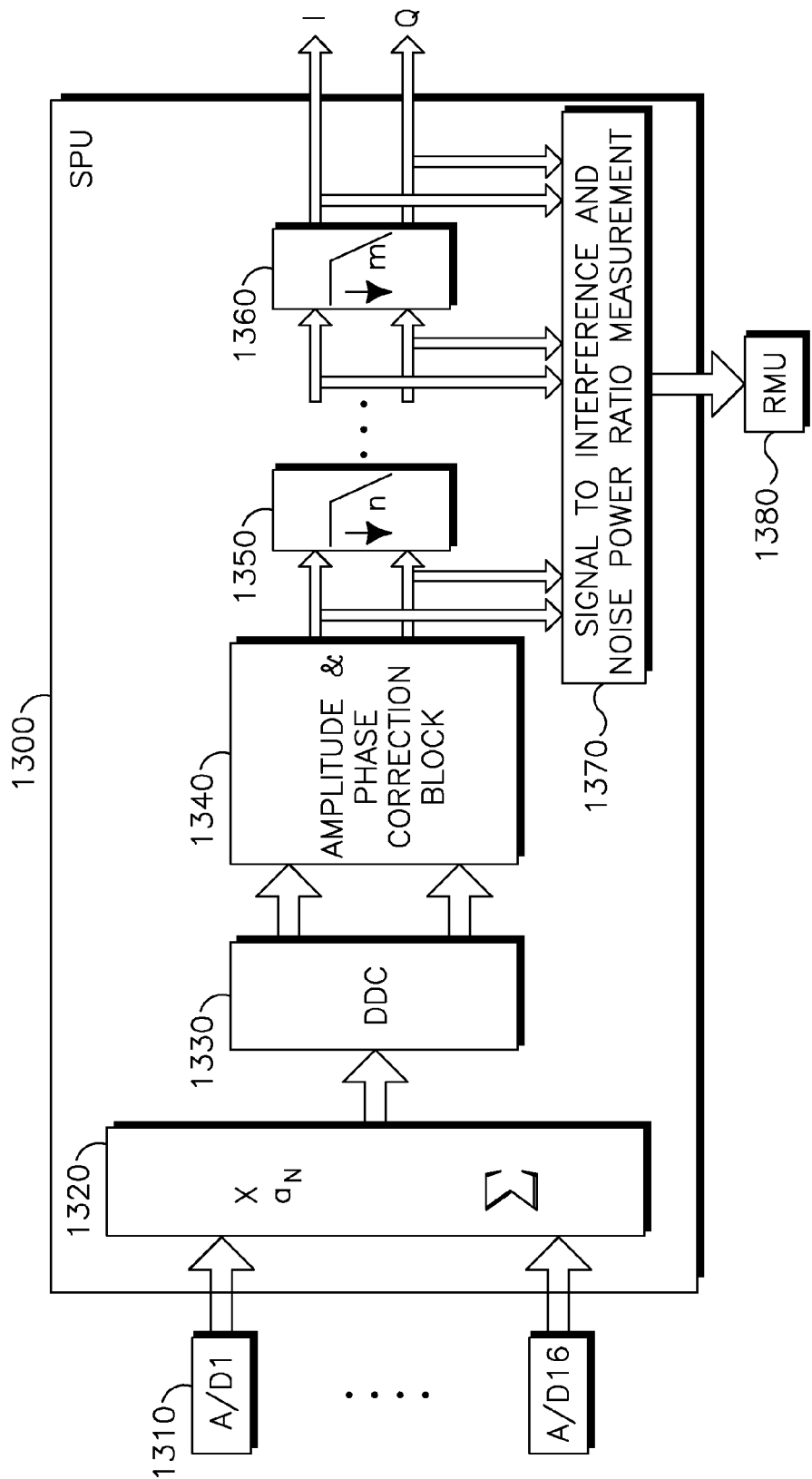
FIG. 13 shows an embodiment of a signal processing unit.

FIG. 13 shows a detailed description of the SPU 1300. The SPU 1300 may combine time-interleaved voltage samples 1310. Each sample may be multiplied by a real or complex number to arrive at weighted samples that are summed 1320. This process is known as basebanding the received signal. A digital down converter (DDC) 1330 may be used to center the basebanded signal at a predetermined center frequency. An amplitude and phase correction block 1340 may also be included. Amplitude and phase variations in the received signal may be introduced as the FEU 1005 in FIG. 10 is transitioned through its various modes. The amplitude and phase correction block 1340 may be used to adjust the received signal by producing an amplitude and phase adjusted signal.

Sample rate reduction (decimation) and filtering may be performed by rate reduction filters 1350 and 1360. The rate reduction and filtering may be done in several stages to produce IQ signals. The output of the DDC 1330 and the output of rate reduction filters 1350 and 1360 may be passed to the Signal to Interference and Noise Power Ratio Measurement mechanism 1370. The Signal to Interference and Noise Power Ratio Measurement mechanism 1370 produces an estimate of the sampled signal quality. The signal quality information may be provided to the RMU 1380. The SPU 1300 may also include calibration and additional impairment correction logic as well as logic to generate additional indicators of received signal quality.

Referring back to FIG. 10, the RMU 1070 may set the FEU mode, as shown in Table 1, through the FEUC 1080 based on the received signal power from the SPU 1050. The FEU mode may also be set based on power or performance needs of the WTRU. A subset of the possible FEU modes for power and performance management is shown in Table 1.

Referring again back to FIG. 10, The LNA gain 1080, the BPS gain 1086 and the A/D resolution 1088 are configurable as shown in Table 1.

TABLE 1

| FEU mode | LNA Gain High | LNA Gain Low | BPS Gain High | BPS Gain Low | A/D Resolution High | A/D Resolution Low | FEU Aggregate Sampling Rate Maximum | Medium | Low |
|---|---|---|---|---|---|---|---|---|---|
| 1 | x |   | x |   | x |   | x |   |   |
| 2 |   | x | x |   | x |   | x |   |   |
| 3 |   | x | x |   | x |   |   | x |   |
| 4 |   | x | x |   | x |   |   |   | x |
| 5 |   | x | x |   |   | x |   |   | x |
| 6 |   | x |   | x | x |   |   |   | x |

If the received signal power is lower than a predetermined threshold, the FEU mode is set to FEU mode 1. In FEU mode 1, performance is at a maximum rate. The FEU 1005 delivers the best performance, but dissipates the most amount of power. On the other hand, if the received signal power is very high, the FEU 1005 may be set to FEU mode 6. In FEU mode 6, the FEU 1005 dissipates the least power, but delivers poor noise performance.

For moderate signal power, if the difference between the interference level and the received signal power is high where the received signal is weaker than the interferer, the FEU 1005 may be set to FEU mode 2. On the other hand, if the difference between the interference level and the received signal power is low, or if no interference exists, the FEU 1005 may be set to FEU mode 5 indicating a moderate received signal power.

Figure 14:
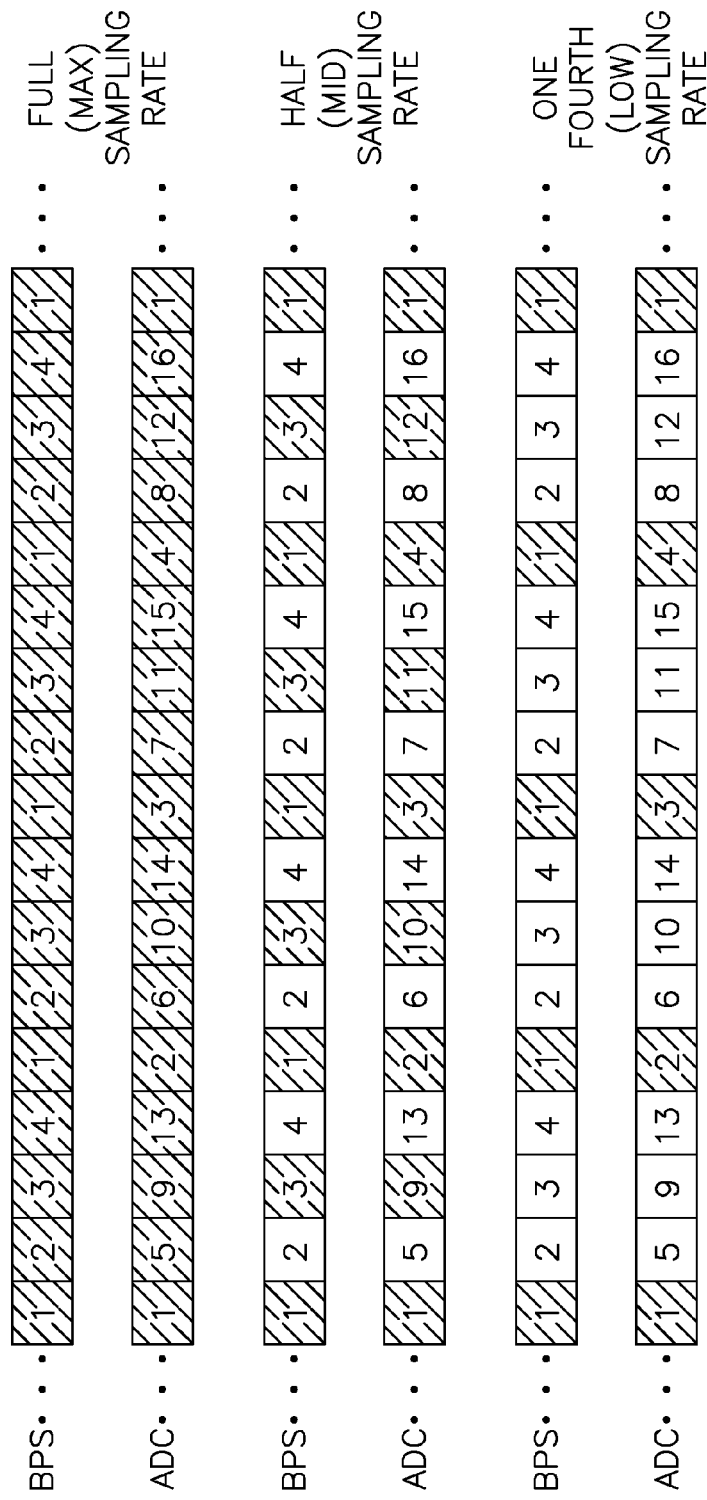
FIG. 14 shows an embodiment of front-end unit sample rate settings.

FIG. 14 shows the FEU 1005 of FIG. 10 may be configured to operate at different aggregate sample rates based on the FEU mode in Table 1. Three examples of sample rates are shown in FIG. 14 including: a full sampling rate, a half sampling rate and a one fourth sampling rate. In the full, or maximum, sampling rate scenario, all time-interleaved bandpass charge samplers 1020 and time-interleaved voltage samplers 1040 are active. In a half, or medium, sampling rate scenario, every other time-interleaved bandpass charge sampler (BPS 1 and BPS 3) 1020 and time-interleaved voltage sampler (A/D1 through A/D 4 and A/D 9 through A/D12) 1030 are active. For example, only two time-interleaved bandpass charge samplers 1020 and eight time-interleaved voltage samplers 1040 may be active. In a one fourth, or low, sampling rate scenario, only one fourth of the time-interleaved bandpass charge samplers 1020 and one fourth of the time-interleaved voltage samplers 1040 are active. For example, only one time-interleaved bandpass charge sampler (BPS 1) 1020 is active and four time-interleaved voltage samplers (A/D 1 through A/D 4) 1040 are active. Other modes including those that deliver one eights, one sixteenth of the full rate are also possible but are not shown in FIG. 14. By selectively turning on and off the time-interleaved bandpass charge samplers 1020 and time-interleaved voltage samplers 1040, the overall sample rate produced by the FEU 1005 is reduced.

Figure 15:
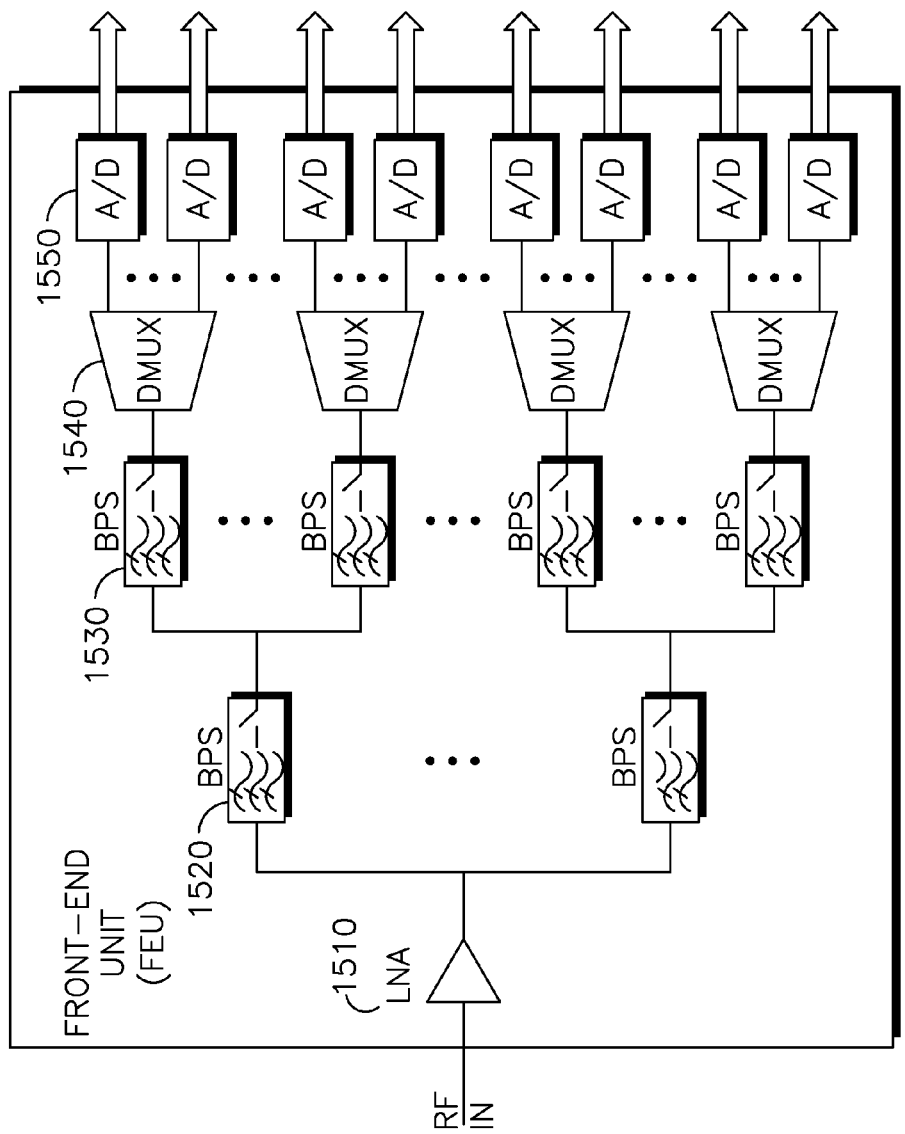
FIG. 15 shows an alternative embodiment of a front-end unit using three stages of arrays.

FIG. 15 is another embodiment. The FEU 1500 employs two different arrays of time-interleaved bandpass charge samplers 1520, 1530 and an array of time-interleaved voltage samplers 1550. The additional array of time-interleaved bandpass charge samplers 1530 are followed by DMUX 1540 which takes the output of the time-interleaved bandpass charge samplers 1530 and separates the output over an array of time-interleaved voltage samplers 1550. The entire array of time-interleaved charge and voltage samplers 1500 may have a greater frequency selective response.

Referring to FIG. 15, the first array of time-interleaved bandpass charge samplers 1520 consists of at least two time-interleaved bandpass charge samplers. For every time-interleaved bandpass charge sampler 1520 in this first array, there are at least two time-interleaved bandpass charge samplers 1530 in the second array. For every time-interleaved bandpass charge sampler 1530 in the second array, there is at least one voltage sampler 1550. A time-interleaved array of bandpass charge samplers may also be used in the place of the time-interleaved voltage samplers 1550. The sampling rate of each of the second array of time-interleaved bandpass charge samplers 1530 is lower than each of the first array of time-interleaved bandpass charge samplers 1520. The bandpass charge samplers in FIG. 15 may be replaced by lowpass charge samplers.

Figure 16:
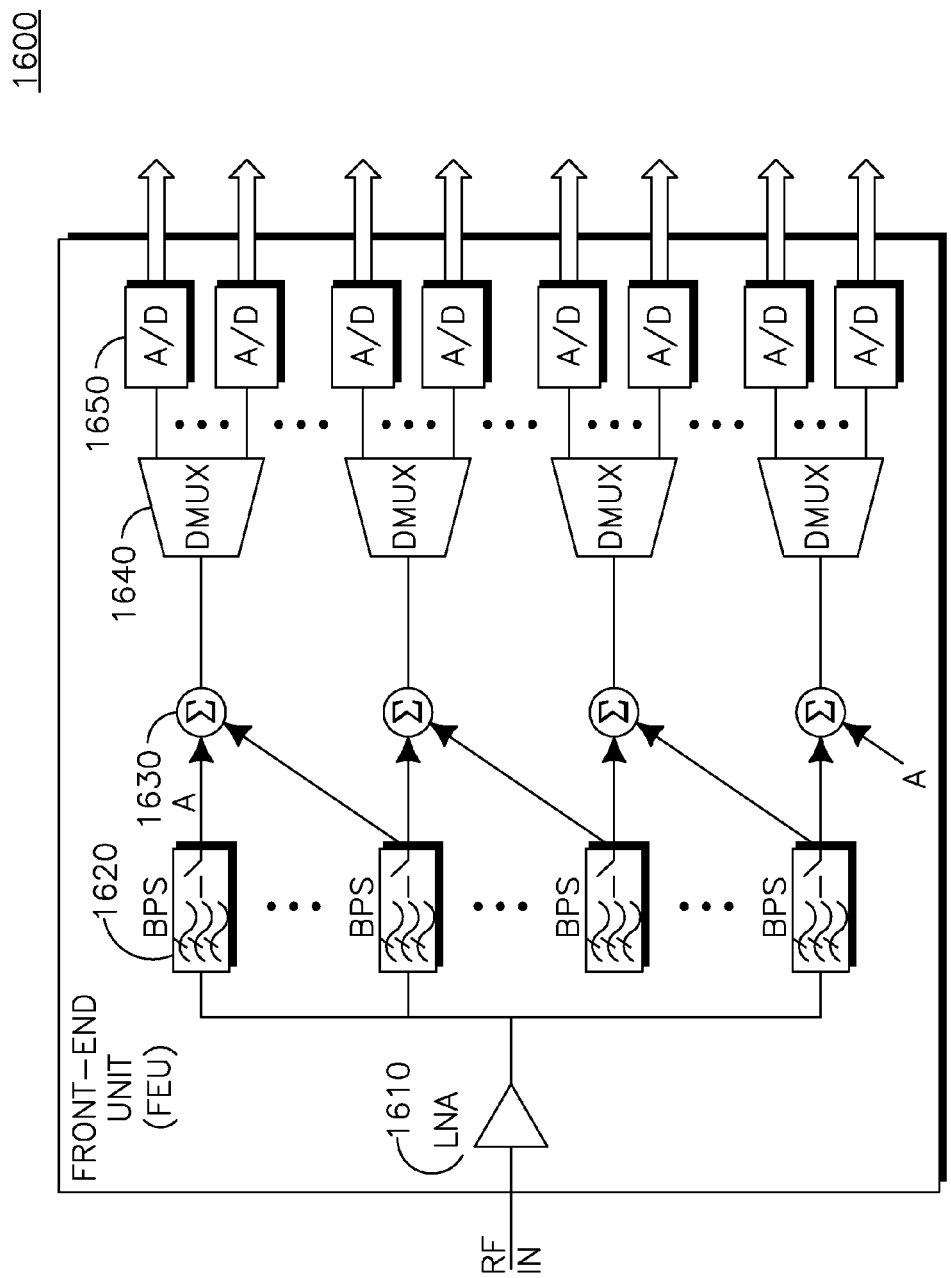
FIG. 16 shows an alternative embodiment of a front-end unit using bandpass charge samplers.

FIG. 16 is an example of combining the outputs from successive time-interleaved bandpass charge samplers in the first array 1620 in order to provide a more frequency selective overall bandpass response. In this example, an array of time-interleaved bandpass charge samplers 1620 is followed by an array of time-interleaved voltage samplers 1650. The output of two successive bandpass charge samplers from the array of time-interleaved bandpass charge samplers 1620 is combined 1630 before the output is sent to the DMUX 1640. Alternatively, the output of three or four or all of the successive bandpass charge samplers may be combined before the output is sent to the DMUX 1640. The DMUX 1640 separates the output over an array of time-interleaved voltage samplers 1650. Time interleaved lowpass charge samplers may be used instead of time-interleaved bandpass charge samplers 1620. Also, time-interleaved voltage samplers 1650 maybe used instead of time-interleaved bandpass charge samplers 1620.

Figure 17:
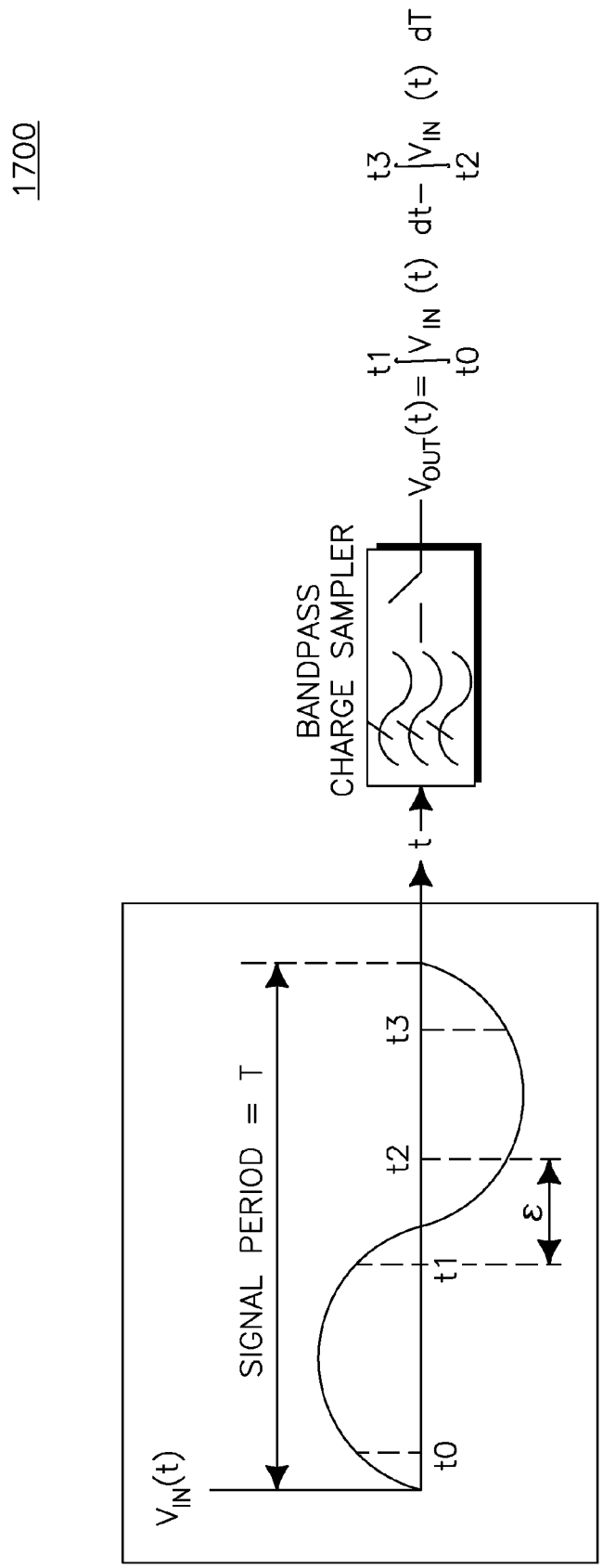
FIG. 17 shows bandpass charge sampler frequency response tuning.

FIG. 17 shows an alternative equation to Equation [1] in FIG. 11:

$$V_{out}(t) = \int_{t0}^{t1} V_{in}(t)\,dt - \int_{t2}^{t3} V_{in}(t)\,dt. \quad \text{Equation [2]}$$

where $t1=t0+\Delta$, $t2=t1+\epsilon$ and $t3=t2+\Delta$. By changing epsilon ($\epsilon$), the gap, the frequency response is altered. A tuning mechanism is implemented to alter the frequency response for time-interleaved bandpass charge samplers. This alteration allows the tuning of the time-interleaved bandpass charge samplers in order to deliver maximum gain at the desired frequency.

Figure 18:
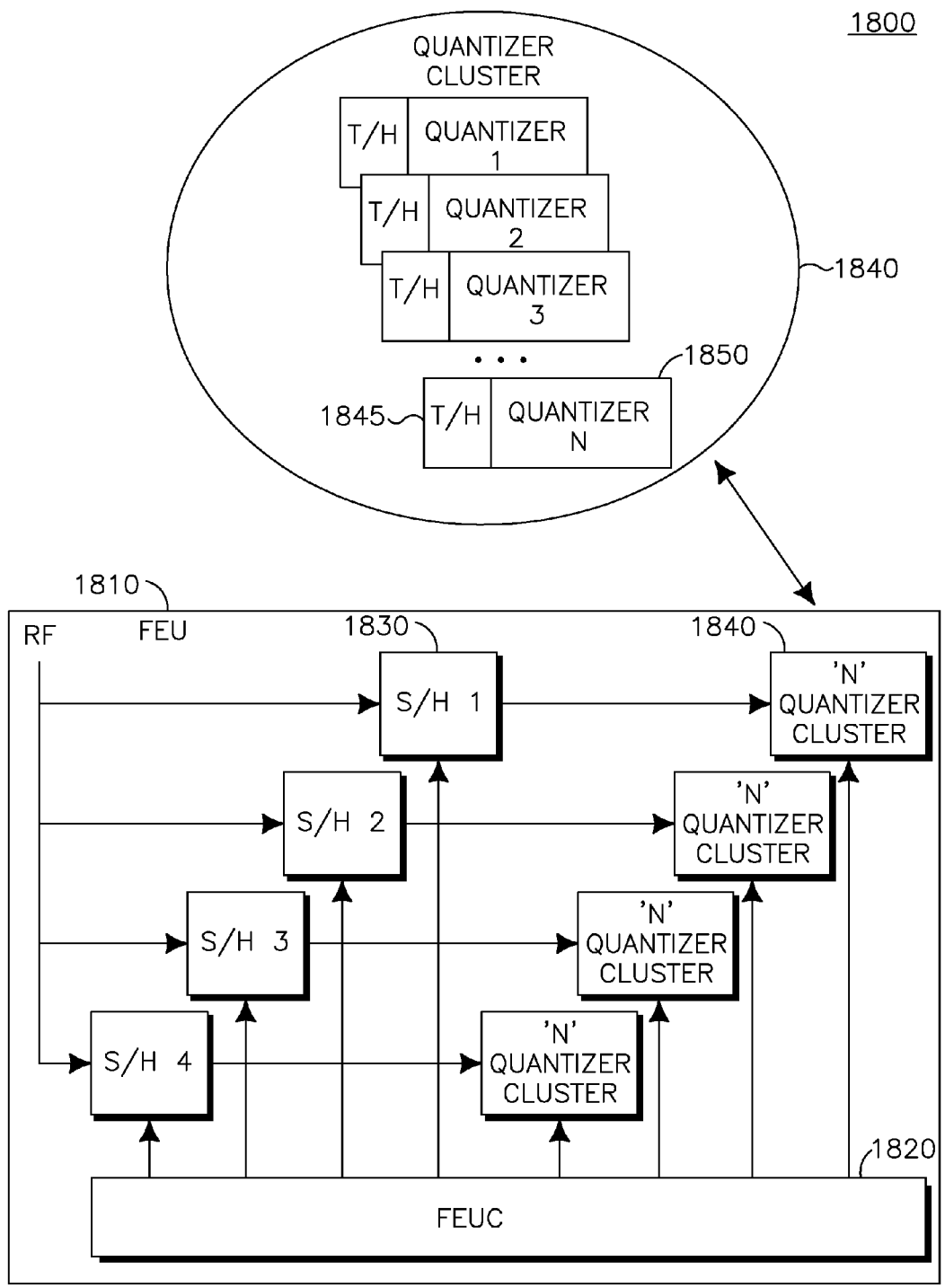
FIG. 18 shows a detailed block diagram of circuitry for reducing the complexity for a time-interleaved direct bandpass sampling WTRU.

FIG. 18 is a detailed block diagram of circuitry for reducing the complexity of time-interleaved direct bandpass sampling in a WTRU. In order to improve performance, a continuous input signal is quantized using time-interleaved quantizers 1850. Quantization is the process of converting a continuous range of values into a finite range of discreet values.

In FIG. 18, the continuous input signal is received and passed to the FEU 1810. The signal is sampled using time-interleaved sample and hold (S/H) circuits 1830. The S/H circuits 1810 are time-interleaved so that only one S/H circuit 1810 is actively sampling the continuous input signal at a time, in a round robin sequence. Each S/H circuit 1810 is a time-interleaved bandpass charge sampler. Each S/H circuit 1810 is associated with a quantizer cluster 1840. The quantizer cluster 1840 includes an array of time-interleaved track and hold circuits (T/H) 1845 coupled to an array of quantizers 1850.

The S/H circuit 1810 samples the continuous time input signal and outputs the sampled value to the associated quantizer cluster 1840. The time-interleaved T/Hs 1845 in the quantizer cluster 1840 holds the sample value to be quantized by the quantizer 1850, while the S/H 1810 prepares to take the next sample. The time-interleaved T/H 1845 passes the sample value to the associated quantizer 1850 for quantization. After quantization the sample is passed to the SPU for further processing.

Referring to FIG. 18, a FEUC 1820 is coupled to both the S/H circuit 1810 and the quantizer cluster 1840. The FEUC 1820 produces a timing signal used for synchronization of the samples.

The features and elements described above may improve performance, reduces circuit complexity, and reduce place and route (P&R) complexity by using a finite number of S/H circuits 1830 operating in continuous time. The T/Hs 1845 operate in a discrete time and therefore can tolerate much higher clock jitter reducing timing and P&R complexity.

In another embodiment, the number of active S/H circuits 1830 may be reduced or increased depending on implementation performance, system clock rates, or other factors.

The features and elements described above may be applicable to digital receivers and may be applicable to all technologies including but not limited to universal mobile telecommunications system (UMTS), general packet radio service (GPRS), global system for mobile communications (GSM), high speed packet access (HSPA) and long term evolution (LTE).

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

As used herein, the term "processor" includes, but is not limited to, a general purpose processor, a special purpose processor, a conventional processor, a digital signal processor (DSP), a plurality of microprocessors, one or more microprocessors in association with a DSP core, a controller, a microcontroller, one or more Application Specific Integrated Circuits (ASICs), one or more Field Programmable Gate Array (FPGA) circuits, any other type of integrated circuit (IC), a system-on-a-chip (SOC), and/or a state machine.

As used herein, the term "circuit" includes any single electronic component of combination of electronic components, either active and/or passive, that are coupled together to perform one or more functions. A circuit may be composed of components such as, for example, resistors, capacitors, inductors, memristors, diodes, or transistors. Examples of circuits include but are not limited to a microcontroller, a processor, and a transceiver.

As used herein, the term "computer-readable medium" includes, but is not limited to, a cache memory, a read-only memory (ROM), a semiconductor memory device such as a D-RAM, S-RAM, or other RAM, a magnetic medium such as a flash memory, a hard disk, a magneto-optical medium, an optical medium such as a CD-ROM, a digital versatile disk (DVD), or Blu-Ray disc (BD), other volatile or non-volatile memory, or any electronic data storage device.

As used herein, the terms "software module" and "firmware module" include, but are not limited to, an executable program, a function, a method call, a procedure, a routine or sub-routine, an object, a data structure, or one or more executable instructions. A "software module" or a "firmware module" may be stored in one or more computer-readable media.

Although features and elements are described above with reference to FIG. 1-18 in particular combinations, each feature or element can be used alone without the other features and elements or in various combinations with or without other features and elements. The sub-elements of the methods or flowcharts described above with reference to FIG. 1-18 may be realized in any order (including concurrently), in any combination or sub-combination. The methods or flow charts described above with reference to FIGS. 1-18 may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a wireless transmit receive unit (WTRU), user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) or Ultra Wide Band (UWB) module.

What is claimed is:

1. A wireless transmit/receive unit (WTRU) comprising:
a front-end unit (FEU) configured to receive a radio frequency (RF) signal and to generate a plurality of time-interleaved samples, wherein the FEU includes:
an array of time-interleaved bandpass charge samplers configured to activate based on a predetermined threshold; and
an array of time-interleaved voltage samplers configured to activate based on the predetermined threshold;
a signal processing unit (SPU) configured to receive and combine the plurality of time-interleaved samples and to generate a signal quality measurement and in-phase and quadrature-phase (IQ) complex samples;
a resource management unit (RMU) configured to receive the signal quality measurement and allocate FEU resources in conjunction with a front-end unit controller (FEUC) based on the signal quality measurement; and
wherein the FEUC is configured to generate a plurality of control signals based on the received signal quality measurement from the RMU, and wherein on a condition that the signal quality measurement is below the predetermined threshold, a plurality of time-interleaved bandpass charge samplers and a plurality of time-interleaved voltage samplers are activated.

2. The WTRU of claim 1 wherein the array of time-interleaved voltage samplers are analog to digital converters (A/Ds).

3. The WTRU of claim 1 wherein on condition that the signal quality measurement is above the predetermined threshold, one or only some of the time-interleaved bandpass charge samplers and four or only some of the time-interleaved voltage samplers, associated with the time-interleaved bandpass charge sampler, are activated.

4. The WTRU of claim 1 wherein the signal quality is measured based on a received signal to total interference ratio.

5. The WTRU of claim 1, further comprising:
an array of de-multiplexers configured to connect each time-interleaved bandpass charge sampler to the array of time-interleaved voltage samplers.

6. The WTRU of claim 1, further comprising:
a multiplexer or a complex finite impulse response (FIR) configured to combine the plurality of time-interleaved samples.

7. The WTRU of claim 1, further comprising:
a low noise amplifier (LNA) configured to receive the RF signal and to transmit the RF signal to the FEU.

8. The WTRU of claim 1 wherein clock signals and the control signals are generated and used to control bias level and gain of the time-interleaved bandpass charge samplers.

9. The WTRU of claim 1 wherein clock signals and the control signals are generated and used to connect time-interleaved voltage samplers to time-interleaved bandpass charge samplers.

10. The WTRU of claim 1 wherein clock signals and the control signals are generated and used to control the resolution of time-interleaved voltage samplers or analog to digital converters (A/Ds).

11. The WTRU of claim 1 wherein the FEU is configured to receive the control signals from the FEUC.

12. A method for dynamic resource allocation in a wireless transmit/receive unit (WTRU), the method comprising:
receiving, at the WTRU, a radio frequency (RF) signal;
generating a plurality of time-interleaved samples based on the RF signal;

combining the plurality of time-interleaved samples and generating a signal quality measurement based on the plurality of time-interleaved samples; and activating an array of time-interleaved bandpass charge samplers and an array of time-interleaved voltage sampler resources based on a predetermined threshold, wherein on a condition that a signal quality measurement is below the predetermined threshold, a plurality of time-interleaved bandpass charge samplers and a plurality of time-interleaved voltage samplers are activated.

13. The method of claim 12 wherein the time-interleaved voltage samplers are analog to digital converters (A/Ds).

14. The method of claim 12 wherein on condition that a signal quality measurement is above the predetermined threshold, one or only some of the time-interleaved bandpass charge samplers and four or only some of the time-interleaved voltage samplers, associated with the time-interleaved bandpass charge sampler, are activated.

15. The method of claim 12 wherein the time-interleaved samples are collected in a uniform or non-uniform manner based upon the signal quality.

16. The method of claim 12 wherein IQ output samples are generated and transmitted to a modem.

17. The method of claim 12 wherein clock and control signals are generated and used to control a low noise amplifier gain and bias level.

18. The method of claim 12 wherein the RF signal is sampled by a time-interleaved sample and hold circuit and output to a quantizer cluster where the RF signal is quantized.

* * * * *

UNITED STATES PATENT AND TRADEMARK OFFICE
CERTIFICATE OF CORRECTION

PATENT NO. : 8,532,039 B2  
APPLICATION NO. : 12/716514  
DATED : September 10, 2013  
INVENTOR(S) : Haque et al.

Page 1 of 1

It is certified that error appears in the above-identified patent and that said Letters Patent is hereby corrected as shown below:

IN THE SPECIFICATION

At column 1, line 23, after the word "has", delete "lead" and insert therefor --led--.

At column 1, line 51, after the word "that", delete "delivers" and insert therefor --deliver--.

At column 4, line 5, at the beginning of the line, delete "FIG." and insert therefor --FIGS.--.

At column 4, line 34, after the word "2A,", delete "2B" and insert therefor --2B,--.

At column 4, line 41, after the word "can", delete "manifests" and insert therefor --manifest--.

At column 5, line 7, after the word "The", delete "multiplier" and insert therefor --multipliers--.

At column 7, line 29, after the word "bandpass", delete "charges" and insert therefor --charge--.

At column 8, line 66, after "deliver one", delete "eights" and insert therefor --eighths--.

At column 9, line 47, after "samplers 1650", delete "maybe" and insert therefor --may be--.

At column 10, line 30, after the word "performance,", delete "reduces" and insert therefor --reduce--.

At column 11, line 2, after the word "component", delete "of" and insert therefor --or--.

IN THE CLAIMS

In claim 6, at column 12, line 4, after the word "(FIR)", insert --filter--.

Signed and Sealed this  
Thirteenth Day of May, 2014

Michelle K. Lee  
*Deputy Director of the United States Patent and Trademark Office*

UNITED STATES PATENT AND TRADEMARK OFFICE
CERTIFICATE OF CORRECTION

PATENT NO.         : 8,532,039 B2
APPLICATION NO.    : 12/716514
DATED              : September 10, 2013
INVENTOR(S)        : Haque et al.

It is certified that error appears in the above-identified patent and that said Letters Patent is hereby corrected as shown below:

IN THE SPECIFICATION

At column 1, line 23, after the word "has", delete "lead" and insert therefor --led--.

At column 1, line 51, after the word "that", delete "delivers" and insert therefor --deliver--.

At column 4, line 5, at the beginning of the line, delete "FIG." and insert therefor --FIGS.--.

At column 4, line 34, after the word "2A,", delete "2B" and insert therefor --2B,--.

At column 4, line 41, after the word "can", delete "manifests" and insert therefor --manifest--.

At column 5, line 7, after the word "The", delete "multiplier" and insert therefor --multipliers--.

At column 7, line 29, after the word "bandpass", delete "charges" and insert therefor --charge--.

At column 8, line 66, after "deliver one", delete "eights" and insert therefor --eighths--.

At column 9, line 47, after "samplers 1650", delete "maybe" and insert therefor --may be--.

At column 10, line 30, after the word "performance,", delete "reduces" and insert therefor --reduce--.

At column 11, line 2, after the word "component", delete "of" and insert therefor --or--.

IN THE CLAIMS

In claim 6, at column 12, line 46, after the word "(FIR)", insert --filter--.

This certificate supersedes the Certificate of Correction issued May 13, 2014.

Signed and Sealed this
Tenth Day of June, 2014

Michelle K. Lee
*Deputy Director of the United States Patent and Trademark Office*

Page 1 of 1